United States Patent
Kawahara et al.

(10) Patent No.: US 10,199,244 B2
(45) Date of Patent: Feb. 5, 2019

(54) IMPRINT APPARATUS, AND METHOD OF MANUFACTURING ARTICLE

(71) Applicant: CANON KABUSHIKI KAISHA, Tokyo (JP)

(72) Inventors: Nobuto Kawahara, Utsunomiya (JP); Yoshikazu Miyajima, Utsunomiya (JP); Zhengmao Ye, Austin, TX (US); Anshuman Cherala, Austin, TX (US); Byung-Jin Choi, Austin, TX (US); Xiaoming Lu, Cedar Park, TX (US); Kang Luo, Austin, TX (US)

(73) Assignee: CANON KABUSHIKI KAISHA, Tokyo (JP)

( * ) Notice: Subject to any disclaimer, the term of this patent is extended or adjusted under 35 U.S.C. 154(b) by 510 days.

(21) Appl. No.: 14/823,075

(22) Filed: Aug. 11, 2015

(65) Prior Publication Data

US 2017/0047234 A1 Feb. 16, 2017

(51) Int. Cl.
*H01L 21/67* (2006.01)
*H01L 21/683* (2006.01)
*H01L 21/304* (2006.01)

(52) U.S. Cl.
CPC ...... *H01L 21/67092* (2013.01); *H01L 21/304* (2013.01); *H01L 21/6833* (2013.01)

(58) Field of Classification Search
CPC combination set(s) only.
See application file for complete search history.

(56) References Cited

U.S. PATENT DOCUMENTS

| | | | |
|---|---|---|---|
| 2010/0096774 A1 | 4/2010 | Kruijt-Stegeman et al. | |
| 2012/0274006 A1 | 11/2012 | Matsumoto et al. | |

FOREIGN PATENT DOCUMENTS

| | | | |
|---|---|---|---|
| JP | 2010098310 A | 4/2010 | |
| JP | 2012234913 A | 11/2012 | |

*Primary Examiner* — Larry W Thrower
(74) *Attorney, Agent, or Firm* — Rossi, Kimms & McDowell LLP

(57) ABSTRACT

An imprint apparatus includes a substrate holder including a plurality of chucking regions for chucking a substrate, and a controller that controls chucking forces of the chucking regions. The chucking regions include a first chucking region for chucking a periphery of a first substrate having a first diameter, a second chucking region for chucking a periphery of a second substrate having a second diameter larger than the first diameter, a third chucking region group divided into a plurality of regions inside the first chucking region, and a fourth chucking region group divided into a plurality of regions between the first chucking region and the second chucking region. The controller controls the chucking forces of each of the chucking regions.

11 Claims, 10 Drawing Sheets

F I G. 2
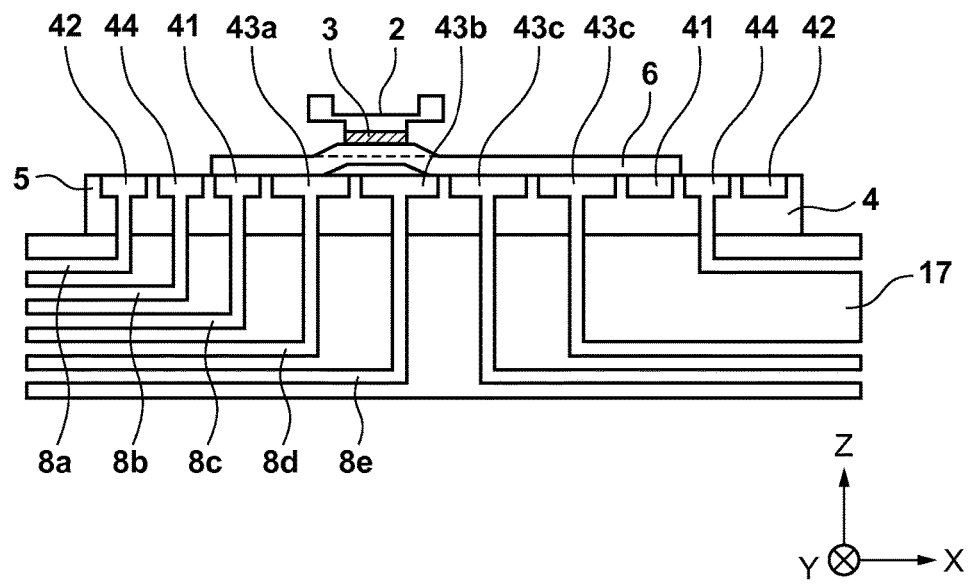
F I G. 3
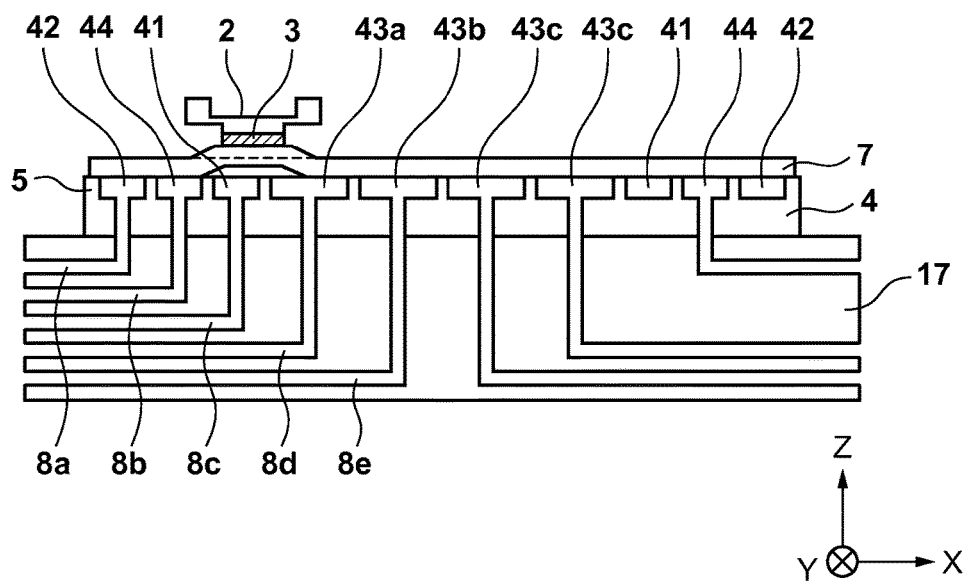

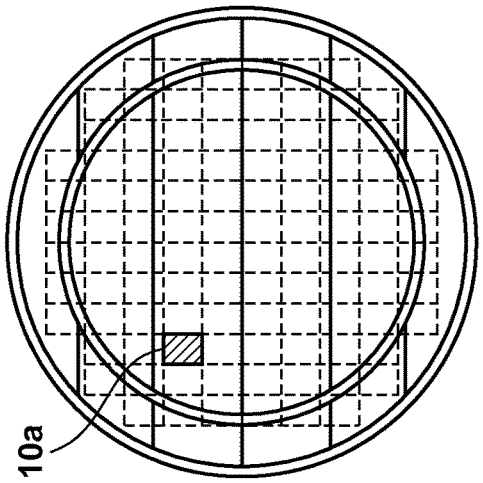
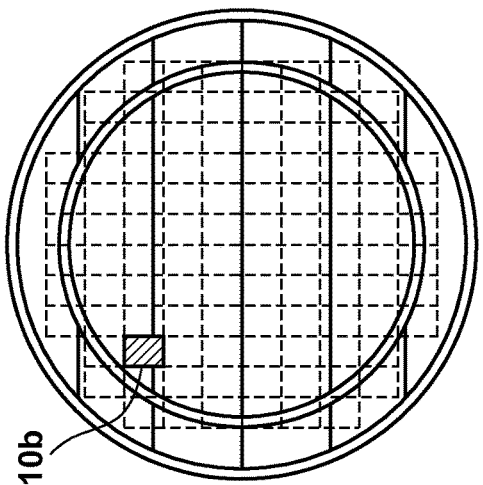
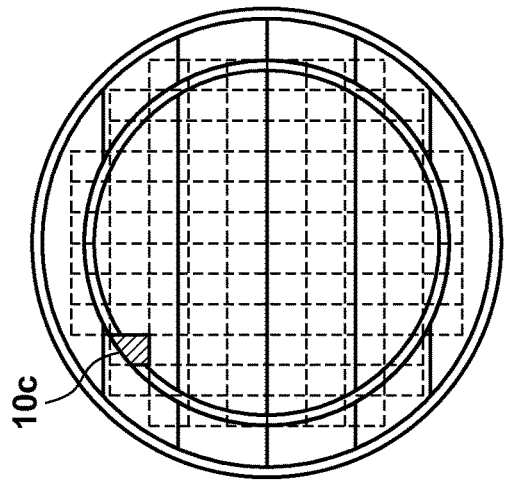

F I G. 13
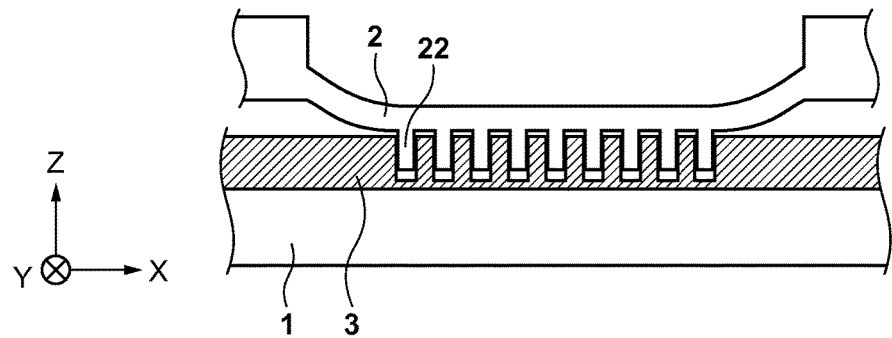
F I G. 14
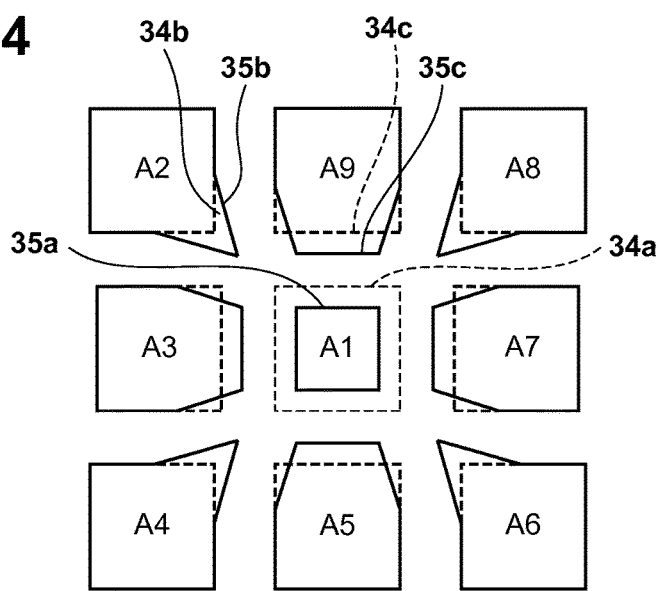
F I G. 15
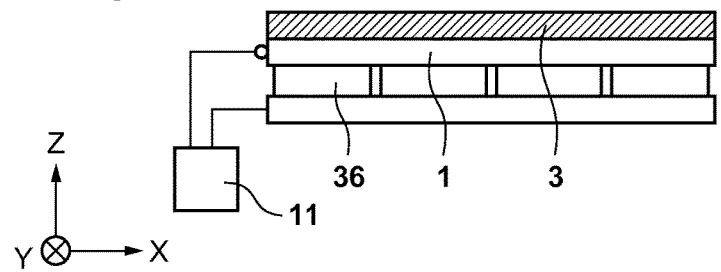

IMPRINT APPARATUS, AND METHOD OF MANUFACTURING ARTICLE

BACKGROUND OF THE INVENTION

Field of the Invention

The present invention relates to an imprint apparatus for molding an imprint material on a substrate by using a mold having patterns formed on it.

Description of the Related Art

An imprint technique which molds an imprint material on a substrate by using a mold having patterns formed on it is attracting attention as a technique of producing a microstructure device. In this imprint technique, a mold having projection-and-recess patterns is used as an original, and the patterns are transferred onto an imprint material on a substrate such as a wafer or glass substrate.

In this process, a separation force of, for example, 100 to 500 N is necessary to separate, from the mold, the imprint material having cured as it has entered gaps between the patterns. Accordingly, many defects may occur due to pattern transfer.

For example, FIG. 13 schematically shows the state of a substrate 1 and mold 2 during separation. Referring to FIG. 13, an imprint material 3 has cured as it has entered between patterns 22 formed on the surface of the mold 2. When lifting up the mold 2 in order to separate it, it is necessary to apply a force of separating, from the patterns 22, the whole imprint material 3 having cured as it has entered between the patterns 22. In this case, after a thin portion of the mold 2 deforms, stress concentration generally occurs in the peripheral portion of the patterns 22, and separation starts from this portion and momentarily spreads over the entire surface. In this state, the patterns 22 are strained in the portion where the stress concentration has occurred, and the strain distribution spreads as the separated portion spreads. As described previously, a force of 100 to 500 N or more is necessary to separate the mold 2 from the imprint material 3. Since this force is momentarily released in the separated portion, a defect such as chipping or deformation sometimes occurs during separation on the patterns 22 of the mold 2 or on the patterns transferred to the cured imprint material 3. FIG. 14 shows a state in which the strain thus produced remains on the substrate 1 immediately after separation. At address A1 of a semiconductor element having undergone separation, an original chip shape 34a deforms into a strained shape 35a. In addition, this shape change exerts influence on addresses adjacent to address A1. For example, at address A2 of the semiconductor element, an original chip shape 34b deforms into a strained shape 35b. Likewise, at address A9, an original chip shape 34c deforms into a strained shape 35c.

In Japanese Patent Laid-Open No. 2012-234913, to prevent the accumulation of this strain on the substrate 1, chucking by a substrate holding mechanism is temporarily released after separation, thereby releasing the residual stress on the substrate 1. Also, in Japanese Patent Laid-Open No. 2010-098310, as shown in FIG. 15, an electrostatic attracting portion of a substrate holder is divided into a plurality of attracting blocks 36, and a controller 11 can partially switch ON/OFF of attracting forces. This makes it possible to partially release attractive fixing of the substrate 1 after separation, and partially release the residual stress.

Unfortunately, the conventional imprint apparatuses do not suppress the occurrence of a strain or defect itself. Therefore, it is possible to release the chucking force of the substrate holder by partially turning off the chucking force after separation is complete, but it is not possible to prevent a strain or defect of patterns which occurs during separation. Also, the division of the chucking regions is set in accordance with the substrate size. If the substrate size is changed, therefore, the substrate holder must be replaced, so the productivity decreases.

Furthermore, if the force (to be referred to as a "separation force" hereinafter) required for separation exceeds 200 N, this force exceeds the force with which the substrate holder chucks the substrate, and the whole substrate is sometimes separated from the substrate holder. This makes it impossible to separate the cured imprint material from the mold. Alternatively, a portion of the substrate is sometimes momentarily floated from the substrate holder and chucked again. In this floated portion, a flaw or damage occurs due to friction between the lower surface of the substrate and the substrate holder.

SUMMARY OF THE INVENTION

The present invention provides, for example, an imprint apparatus that can suppress a pattern strain or defect occurring on a substrate in the separation stage of the imprint step, for a plurality of substrates having different sizes.

According to an aspect of the present invention, there is provided an imprint apparatus which molds an imprint material on a substrate by using a mold having a pattern formed thereon. The apparatus includes a substrate holder including a plurality of chucking regions for chucking the substrate, and a control unit configured to control chucking forces of the plurality of chucking regions. The chucking regions include a first chucking region for chucking a periphery of a first substrate having a first diameter, a second chucking region for chucking a periphery of a second substrate having a second diameter larger than the first diameter, a third chucking region group divided into a plurality of regions inside the first chucking region, and a fourth chucking region group divided into a plurality of regions between the first chucking region and the second chucking region. The control unit controls the chucking forces of the first, second, third, and fourth chucking regions.

Further features of the present invention will become apparent from the following description of exemplary embodiments (with reference to the attached drawings).

BRIEF DESCRIPTION OF THE DRAWINGS

FIG. 2 is a view for explaining the state of separation by the substrate holder.

FIG. 3 is a view for explaining the state of separation by the substrate holder.

FIGS. 6A-6C are views for explaining the state of chucking when imprinting a substrate having a first diameter.

FIG. 13 is a view for explaining the state of separation;

FIG. 14 is a view for explaining the state of strain in an imprint region and its periphery immediately after mold release; and FIG. 15 is a view for explaining an example of the structure of a conventional substrate holder.

DESCRIPTION OF THE EMBODIMENTS

Various exemplary embodiments, features, and aspects of the invention will be described in detail below with reference to the drawings. Note that the present invention is not limited to the following embodiments, and these embodiments are merely practical examples advantageous when carrying out the present invention. Note also that not all combinations of features explained in the following embodiments are essential for the present invention to solve the problem.

<First Embodiment>

Figure 1:
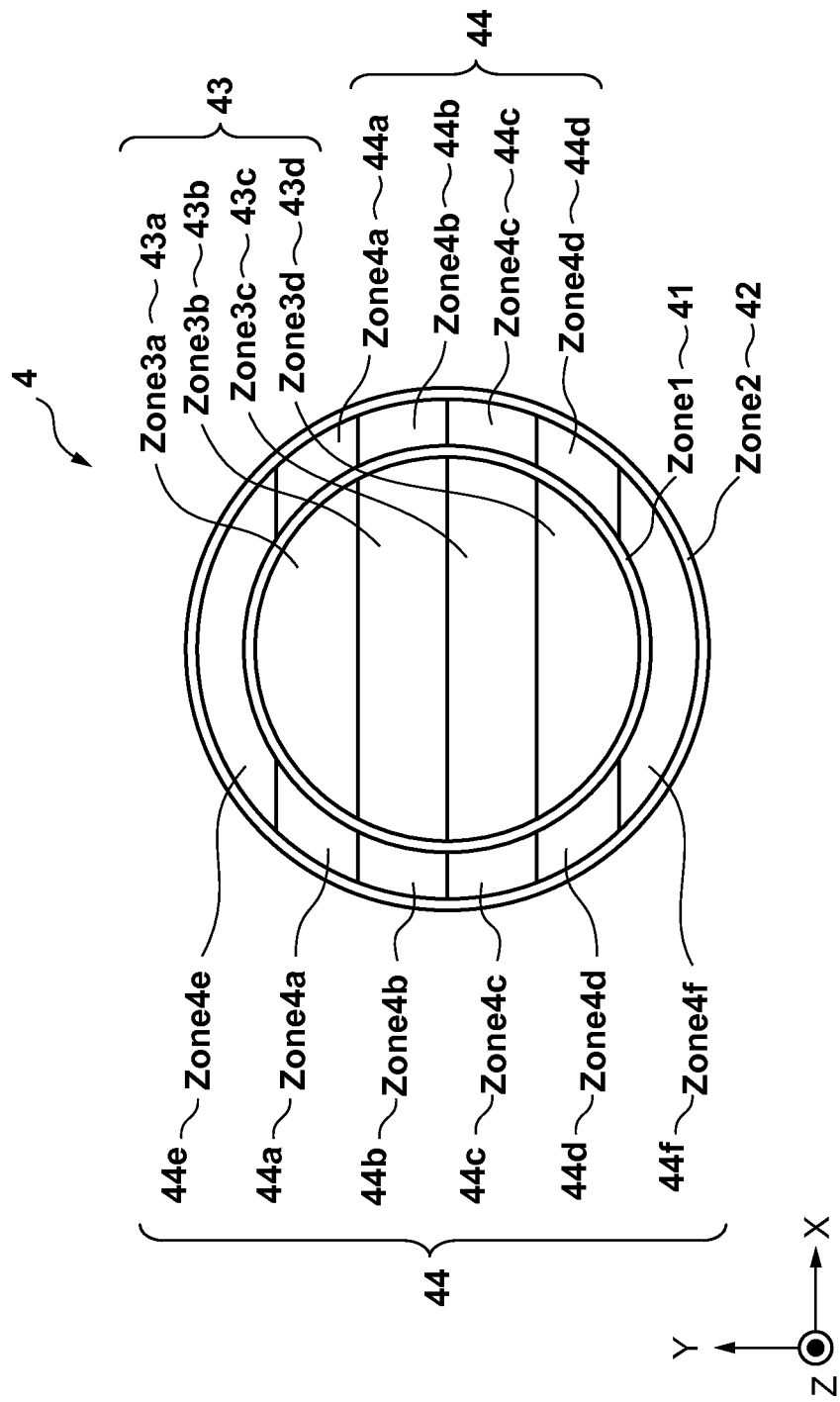
FIG. 1 is a view showing the structure of a substrate holder according to an embodiment.

FIG. 1 is a view showing the arrangement of a substrate holder 4 installed in an imprint apparatus of the first embodiment. FIGS. 2 and 3 show sections when the substrate holder 4 is used. In FIG. 2, the diameter of a substrate 6 having a first diameter is, for example, •300 mm. In FIG. 3, the diameter of a substrate 7 having a second diameter is, for example, •450 mm. The substrate holder 4 has a ring-like chucking region indicated by a first chucking region 41 (Zone1) along the diameter of the substrate 6 having the first diameter, and the first chucking region 41 is connected to a negative pressure generator (not shown) by a pipe 8c. On the other hand, the substrate holder 4 has a ring-like chucking region indicated by a second chucking region 42 (Zone2) along the diameter of the substrate 7 having the second diameter, and the second chucking region 42 is connected to the negative pressure generator (not shown) by a pipe 8a. The first chucking region 41 (Zone1) and second chucking region (Zone2) are concentrically arranged as shown FIG. 1, each have a groove-like shape having a width of 5 to 10 mm, and each can chuck and fix the substrate by setting a negative pressure inside the groove.

A chucking region inside the first chucking region 41 (Zone1) is divided into four chucking regions 43a (Zone3a), 43b (Zone3b), 43c (Zone3c), and 43d (Zone3d) having equal areas by three parallel straight lines. These four chucking regions will collectively be called a third chucking region group 43.

Also, a chucking region outside the first chucking region 41 (Zone1) and inside the second chucking region 42 (Zone2) is divided into six chucking regions by straight lines extended from the boundary straight lines in the third chucking region and by two straight lines added to the two sides of the extended straight lines. The six chucking regions are 44a (Zone4a), 44b (Zone4b), 44c (Zone4c), 44d (Zone4d), 44e (Zone4e), and 44f (Zone4f). These six chucking regions will collectively be called a fourth chucking region group 44.

Note that the positions of the two added straight lines described above are determined such that the areas of the four chucking regions 44a (Zone4a), 44b (Zone4b), 44c (Zone4c), 44d (Zone4d) are equal.

Figure 4:
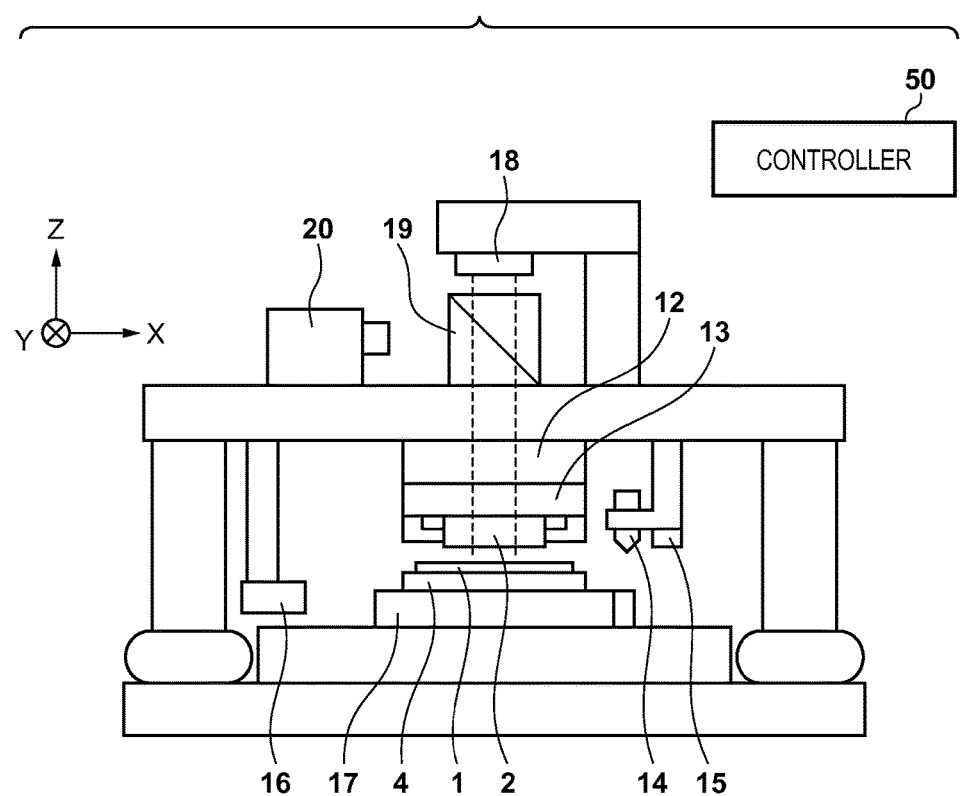
FIG. 4 is a view showing the arrangement of an imprint apparatus according to the embodiment.

FIG. 4 is a view showing the arrangement of an imprint apparatus according to this embodiment. The imprint apparatus molds an imprint material on a substrate by using a mold having patterns formed on it. As shown in FIG. 4, the substrate holder 4 is placed on a substrate stage 17, and a substrate 1 is chucked on the substrate holder 4. First, an alignment optical system (not shown) acquires positional shift information by observing alignment marks on the substrate 1. At the same time, a height measuring device 15 measures the distance from the height measuring device 15 to the upper surface of the substrate 1. On the other hand, a mold 2 is held by a mold holder 13. Since the relative heights of the pattern surface of the mold 2 and the height measuring device 15 are measured in advance, the distance from the upper surface of the substrate 1 to the pattern surface of the mold 2 can be calculated. A dispenser 14 supplies a photocuring resin as an imprint material 3 on the substrate 1. When the mold 2 is moved down and brought into tight contact with the imprint material with a gap of a few nm being left behind between the mold 2 and substrate 1, the imprint material flows into grooves of patterns. The mold 2 is formed by a material which is transparent to light (ultraviolet light) which cures the imprint material. Therefore, the imprint material cures when irradiated with ultraviolet light emitted by a light source 20 from above the mold 2. When the mold 2 is moved up after that, an inverted image of the patterns obtained by the cured imprint material is formed on the substrate. A controller 50 (control unit) comprehensively controls these imprint steps.

First, a case in which the imprint steps are performed on the substrate 6 having a diameter of φ300 mm will be explained. The substrate 6 having a diameter of φ300 mm is mounted on the substrate holder 4 such that the outer circumferential surface is aligned with the chucking region 41 (Zone1) shown in FIG. 1. The substrate 6 is chucked and fixed on the substrate holder 4 when a pressure adjusting device (not shown) adjusts the interiors of the first chucking region 41 and third chucking region group 43 at a negative pressure of −100 kPa. In this state, the second chucking region and fourth chucking region group cannot form any closed state because nothing is mounted on a region outside the substrate 6. Accordingly, even when these chucking regions are connected to the negative pressure generator (not shown), the pressure inside the chucking regions does not decrease. By measuring the pressure of the second chucking region or fourth chucking region group, therefore, it is possible to confirm that the substrate 6 having a wrong diameter has not been conveyed. Furthermore, the height measuring device 15 can measure the height from the substrate holder 4 to the surface of the substrate 6 (that is, the thickness of the substrate 6). By comparing the value with the thickness standard of the substrate 6 having a diameter of φ300 mm, it is possible to reconfirm that the substrate 6 is not a wrong substrate. Note that the controller 50 also independently controls the chucking forces of the plurality of chucking regions.

Subsequently, the substrate stage 17 conveys the substrate 6 to a position where imprinting is performed, and the imprint step begins. In the separating stage of the imprint step as described earlier, as shown in FIG. 13, the imprint material 3 having entered the gaps between the patterns 22 is cured, and the mold 2 is moved up and separated while the substrate 1 is fixed. Therefore, the force of separating, from the patterns 22, the whole imprint material 3 having entered between the patterns 22 and cured is required. In this case, after a thin portion of the mold 2 deforms, stress concentration generally occurs in the peripheral portion of the patterns 22, and separation starts from this portion and momentarily extends over the entire surface. In this state, the patterns 22 are strained in the portion where the stress concentration has occurred, and the strain distribution spreads as the separated portion spreads.

In the imprint apparatus according to this embodiment, therefore, immediately before the separating stage begins, the force of chucking the substrate 6 is locally weakened with respect to a position corresponding to the separated portion. Consequently, the substrate 6 is locally raised as shown in FIG. 2, and the forces in the separation direction are set in an equilibrium state on the mold 2 side and substrate 6 side. In this state, the substrate 6 and mold 2 have deformed into projecting shapes in the periphery of the portion where the substrate 6 and mold 2 are brought into contact with each other by the imprint material 3, so separation readily occurs in the periphery of this contact portion. To separate the entire surface of the contact portion at once, a separation force of 100 to 500 N is necessary as explained earlier. By contrast, it is possible to gradually advance separation by a separation force of ½ to 1/10 by forming a state in which separation readily occurs from the peripheral portion.

Figure 12:
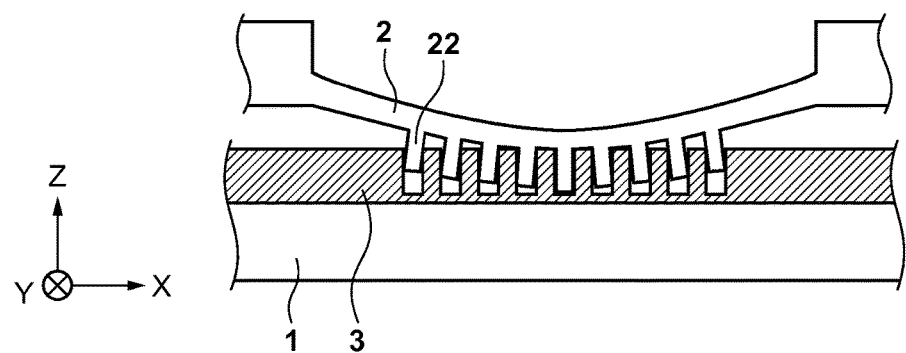
FIG. 12 is a view for explaining the state of separation.

Also, to further reduce the separation force, as shown in FIG. 12, a compressed gas is supplied to the surface of the mold 2, which is opposite to the pattern surface, immediately before the separating stage, thereby deforming the mold 2 into a projecting shape toward the substrate. This can accelerate the phenomenon in which separation gradually occurs from the peripheral portion of the patterns 22.

Figure 5A:
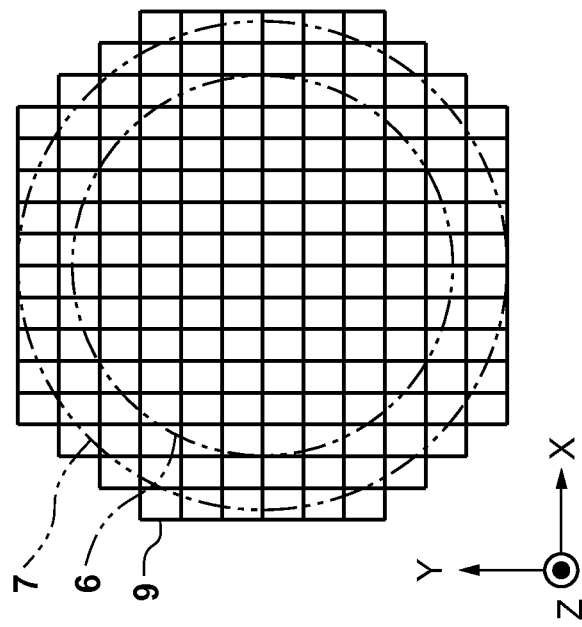
FIGS. 5A-5B are views showing examples of an imprint layout.
Figure 5B:
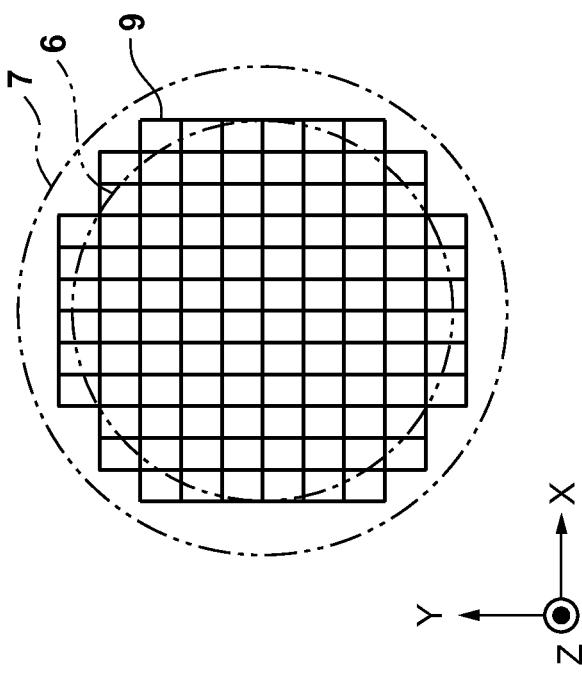

FIG. 5A shows an imprint layout 9 when imprinting the substrate 6 having the first diameter, that is, a diameter of φ300 mm, and each rectangle is equivalent to one semiconductor chip (to be simply referred to as a "chip" hereinafter). FIGS. 6A-6C show the imprint layout 9 by overlying it on the substrate holder 4. For example, in the separating stage of the imprint step of a chip position 10a shown in FIG. 6A, the internal pressure of only the chucking region 43b (Zone3b) of the third chucking region group 43 is switched from a negative pressure of −100 kPa to a negative pressure −10 kPa with respect to the atmospheric pressure, thereby weakening the chucking force. Consequently, as shown in FIG. 2, the substrate 6 can locally float from the substrate holder 4. Similarly, in the separating stage of the imprint step of a chip position 10b shown in FIG. 6B, the internal negative pressure of the chucking regions 43a (Zone3a) and 43b (Zone3b) is switched such that the pressure approaches the atmospheric pressure (weakens), thereby weakening the chucking forces. Also, in the separating stage of the imprint step of a chip position 10c shown in FIG. 6C, the internal negative pressure of the chucking region 43a (Zone3a) is switched so that the pressure approaches the atmospheric pressure, thereby weakening the chucking force.

As described above, a region whose internal negative pressure is to be weakened changes in accordance with a chip position. The third chucking region group 43 is divided into the four regions having equal areas as explained earlier, so two or more chucking regions always keep strong chucking forces regardless of a chip position. Therefore, an area of ½ or more of the third chucking region group 43 can chuck the substrate 6 with a strong chucking force.

Figure 11:
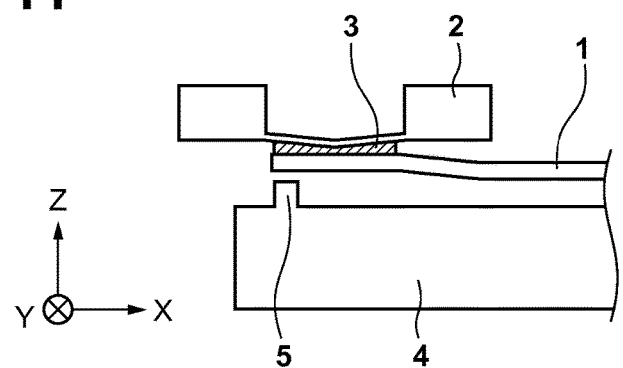
FIG. 11 is a view for explaining the state of separation.

Next, a case where an imprint target chip extends over the periphery of the substrate like the chip position 10c shown in FIG. 6C or is adjacent to the chip extending over the periphery and positioned closer to the center of the substrate will be explained. In this case, as shown in FIG. 11, a phenomenon in which the substrate 1 separates from a partition 5 before the imprint material 3 is separated from the mold 2 readily occurs. Especially when the chucking force of the chucking region 43a (Zone3a) is weakened, this abnormal separation readily occurs because the chucking force acting on the whole chip position 10c is weak. Accordingly, this embodiment maintains a strong chucking force without weakening the chucking force of the chucking region 41 (Zone1) positioned on the periphery of the substrate 1 in the separating stage of the chip position 10c.

As described above, an area of ½ or more of the third chucking region group 43 always chucks the substrate 6 with a strong chucking force. The ratio of this area having a strong chucking force further increases when the chucking region 42 (Zone2) always holds a strong chucking force.

In the imprint apparatus of this embodiment as described above, the substrate holder 4 having a chucking force optimum for the substrate 6 having a diameter of φ300 mm is formed. Also, the imprint apparatus of this embodiment can imprint the substrate 7 having a diameter of φ450 mm (the second diameter) without replacing the substrate holder 4. As shown in FIG. 1, the substrate holder 4 includes the second chucking region 42 outside the first chucking region 41, and the fourth chucking region group 44 formed by dividing the region between the first and second chucking regions 41 and 42 into a plurality of regions. As shown in FIG. 3, the chucking regions 42 and 44 are respectively connected to the negative pressure generator (not shown) by the pipe 8a and a pipe 8b independent of the internal chucking regions 41 and 43, and can chuck the substrate 7 having the second diameter.

Figure 7:
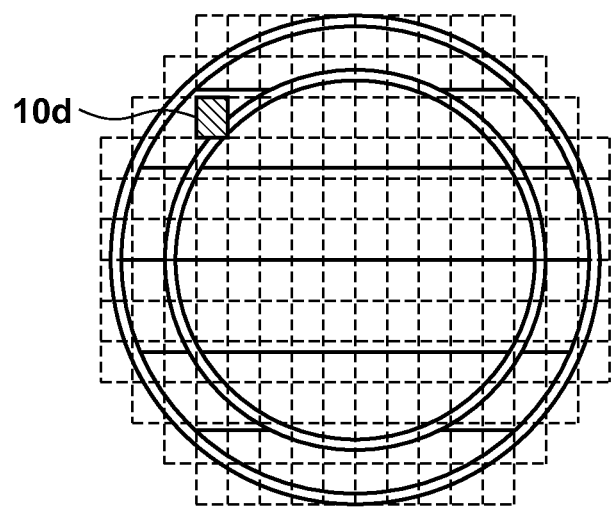
FIG. 7 is a view for explaining the state of chucking when imprinting the substrate having the first diameter.

The substrate 7 having the second diameter can be imprinted in the same manner as that for the substrate 6 having the first diameter. That is, after the substrate 7 is mounted on the substrate holder 4, the pressure adjusting device (not shown) adjusts the internal negative pressure at −100 kPa in all the chucking regions below the substrate 7. Then, when a chip position 10d as shown in FIG. 7 comes to the separating stage, the internal pressure of the chucking region 44a (Zone4a) shown in FIG. 1 is changed to a negative pressure of −10 kPa with respect to the atmospheric pressure, thereby weakening the chucking force. Consequently, as in the case of the substrate 6 having the first diameter, the substrate 7 in the portion where the chucking force is weakened partially floats from the substrate holder 4 as shown in FIG. 3. This makes it possible to prevent a defect in the separating stage.

In the example shown in FIG. 1, the boundary lines in the fourth chucking region group are straight lines extending from the straight lines dividing the second chucking region. Also, Zone4e and Zone4f are divided by the boundary lines which give equal areas to Zone4a, Zone4b, Zone4c, and Zone4d. The chucking region on the substrate holder 4 is divided finer for the substrate 7 having a diameter of φ450 mm than for the substrate 6 having a diameter of φ300 mm. Accordingly, an area of ½ or more of the substrate 7 is, of course, always chucked by a strong chucking force regardless of the position of a chip.

Another example of the division of the fourth chucking regions will be presented below.

Figure 8A:
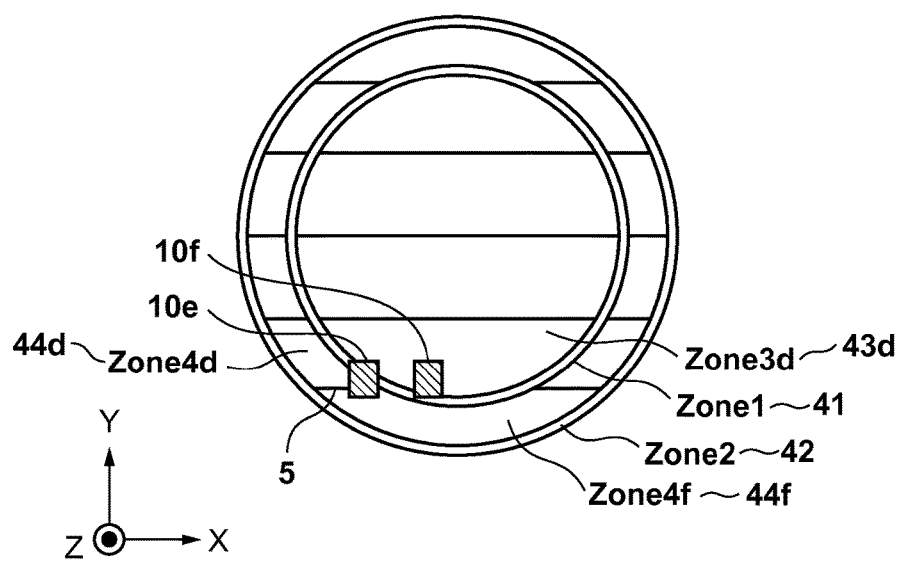
FIGS. 8A-8B are views showing examples of the division of chucking regions of the substrate holder.
Figure 8B:
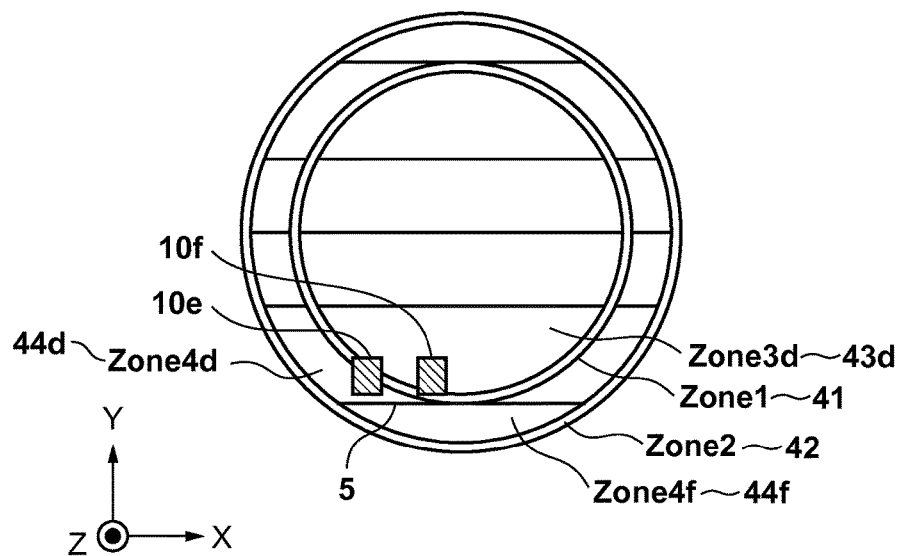

In an example shown in FIG. 8A, in the separating stage of a chip position 10f, the chucking forces of two chucking regions, that is, Zone1 and Zone3d need only be switched. However, in the separating stage of a chip position 10e on the same level as that of the chip position 10f in the Y direction, the chucking forces of three chucking regions, that is, Zone1, Zone3d, and Zone4d must be switched. That is, although the chip position has moved in only the X direction, it is necessary to control the chucking force of the chucking region in the Y direction, and this complicates the control. As shown in FIG. 8B, therefore, the boundary line of Zone4f may also be a straight line circumscribed to the circumferential circle of Zone1. In this case, the chucking forces of two chucking regions, that is, Zone3d and Zone4d need only be switched in the separating stage of the chip position 10e. When the chip position has moved in only the X direction, therefore, the chucking force need not be switched in a region in the Y direction, and this facilitates the control.

Figure 9A:
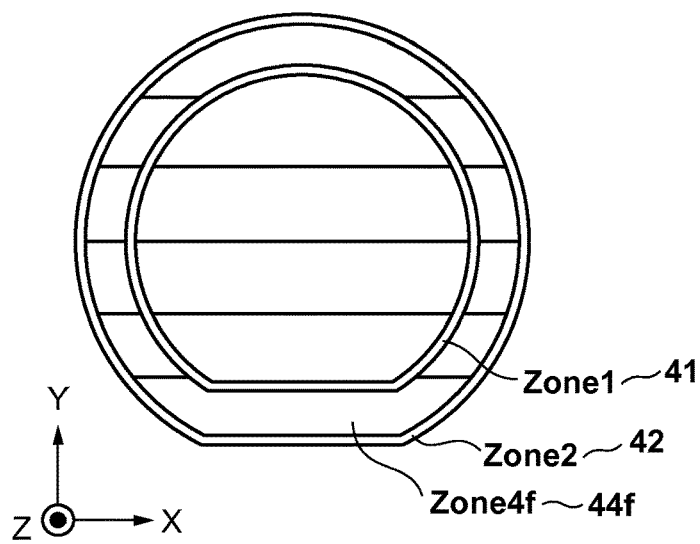
FIGS. 9A-9B are views showing the structures of substrate holders corresponding to a substrate having a straight portion.
Figure 9B:
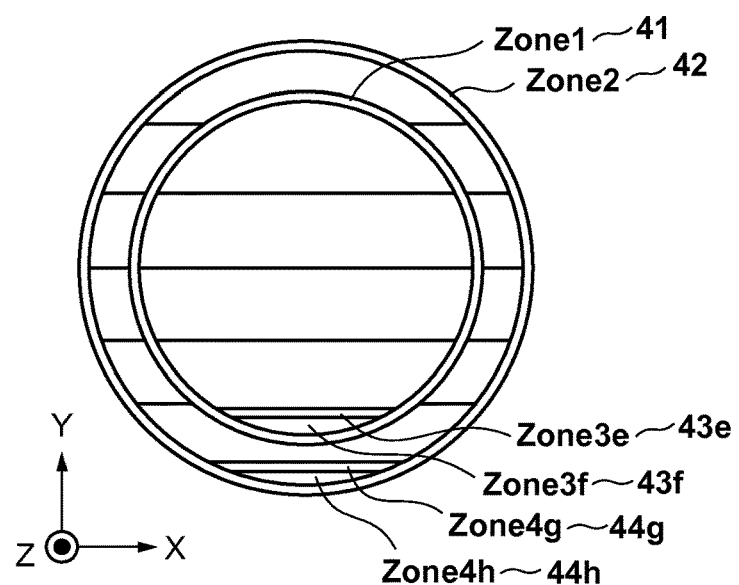

Also, in the above-described example, the case where the peripheral shape of each of the substrate 6 having the first diameter and the substrate 7 having the second diameter is a circle has been explained. However, a substrate having a straight portion is often used for the reasons of processing and handling. FIGS. 9A-9B show the shapes of the substrate holders 4 corresponding to a substrate having a straight portion. This substrate has a shape enclosed with an arc having a central angle of 180 degree or more, and a straight line connecting the two ends of the arc. Referring to FIG. 9A, the peripheral shapes of the first and second chucking regions 41 and 43 are changed in accordance with the outer shape having the straight portion, for both the substrate 6 having the first diameter and the substrate 7 having the second diameter. This prevents the inconvenience that the substrate holder 4 shown in FIG. 1 cannot chuck a portion of the periphery because the airtightness of a partial chucking region breaks.

In the substrate holder 4 shown in FIG. 9B, chucking regions 43e (Zone3e) and 44g (Zone4g) equal to the width of the chucking region of Zone1 or Zone2 are added to positions matching the outer shape of the straight portion of the substrate, in addition to the divisional shape of the substrate holder 4 shown in FIG. 1. In this embodiment, both the substrate 6 having the first diameter and the substrate 7 having the second diameter can be chucked regardless of whether the peripheral shape corresponds to a circle or a circle including a straight portion. Also, even a substrate having a circular outer shape generally has a small V-shaped cut called a notch in a portion thereof. It is practical to match the groove shape of the chucking regions 41 and 42 with the shape of this notch, in order to prevent the break of airtightness from the notch.

<Second Embodiment>

Figure 10:
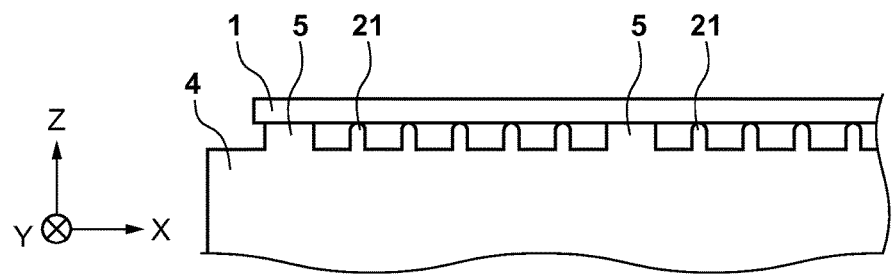
FIG. 10 is a view for explaining the structure of a substrate holder according to the second embodiment.

The above-described first embodiment can reduce defects occurring during separation by locally weakening the chucking force by dividing the chucking region of the substrate holder 4. Each divided chucking region forms a space defined by partitions. However, the substrate holder in which the chucking region is divided by the partitions and a negative pressure is set inside each chucking region has the drawback that the substrate surface warps toward the substrate holder 4 as the spacing between the partitions increases. This deformation further increases as the chucking force of an adjacent chucking region decreases. FIG. 10 shows the arrangement of a substrate holder 4 according to the second embodiment. Referring to FIG. 10, a plurality of posts 21 having a columnar shape whose diameter is, for example, 1 mm or less are arranged in a chucking region in addition to partitions 5. The height of the posts 21 is the same as that of the partitions 5, and the edge of the end face of each column is rounded so as not to give any damage to the surface of a substrate 1. Even when the chucking region has a negative pressure, therefore, the substrate 1 is supported by the posts 21 and hence does not deform toward the negative-pressure side.

When the posts 21 have the same height, however, the height of the partitions 5 may also be made larger by, for example, 1 to 10 m than that of the posts 21. This is so because when the internal space of the partitions 5 is connected to a negative pressure generator, the internal space of the partitions 5 can be held in a negative-pressure state. The posts 21 and partitions 5 can have a height difference within a difference range like this.

<Third Embodiment>

The method which generates a negative pressure between a substrate and the substrate holder 4 and switches the negative pressure in the imprint step for each of a plurality of divided chucking regions 31 in order to chuck the substrate has been explained above. However, the means for generating the chucking force is not limited to a negative pressure. For example, the chucking force to be used in the substrate holder 4 may also be electrostatic attraction or magnetic attraction. In addition, the divisional shape of the chucking region is not limited to the concentric circle or horizontal shape. For example, it is also possible to use a radial shape, a matrix, or a composite pattern thereof.

In the above-described example, the chucking force is weakened by switching the internal pressure of a target chucking region from a negative pressure of −100 to a negative pressure of −10 kPa with respect to the atmospheric pressure. However, the value of the negative pressure is not limited to this. The value of the negative pressure can be set in accordance with the mold release force, and a normal chucking force can be a minimum necessary pressure which prevents a shift of a substrate. Furthermore, the pressure to be weakened need only be set at an appropriate pressure capable or reducing the mold release force within a range in which no vacuum break occurs.

The above embodiments will be summarized below.

First, a region for chucking the periphery of a first substrate having a first diameter and a region for chucking the periphery of a second substrate having a second diameter larger than the first outer shape are formed in a substrate holder. This makes it possible to chuck substrates having different diameters by the same substrate holder. In addition, third chucking regions divided into four or more regions by, for example, parallel straight lines are formed inside the first chucking region. Consequently, even when imprinting is performed in a position extending over two chucking regions inside the first chucking region, the remaining two or more regions can chuck the substrate without weakening the chucking forces. This prevents separation of the substrate due to an insufficient chucking force in the separating stage. Also, the surface shape of the substrate is partially deformed by adding an operation of switching chucking forces in synchronism with the process of the imprint step. This makes it possible to switch chucking forces so as to suppress the occurrence of stress concentration due to the separation force during separation. As a consequence, the occurrence of a pattern strain or defect can be suppressed.

<Method of Manufacturing Article>

A method of manufacturing an article according to an embodiment of the present invention is suitable for manufacturing an article, for example, a microdevice such as a semiconductor device or an element having a microstructure. This manufacturing method includes a step of forming a pattern on a substrate by using an imprint apparatus. The manufacturing method can further include other well-known steps of processing the substrate on which the pattern is formed (for example, oxidation, deposition, vapor deposition, doping, planarization, etching, imprint material separation, dicing, bonding, and packaging). The method of manufacturing an article according to this embodiment is more advantageous than any conventional methods in at least one of the performance, quality, productivity, and production cost of the article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. An imprint apparatus for imprinting a pattern on an imprint material on a substrate using a mold having the pattern, the imprint apparatus comprising:
   a substrate holder including a plurality of chucking regions for chucking the substrate; and
   a control unit configured to control chucking forces of the plurality of chucking regions,
   wherein the plurality of chucking regions include:
      a first chucking region having a first groove having a ring shape for chucking a periphery of a first substrate having a first diameter;
      a second chucking region having a second groove having a ring shape for chucking a periphery of a second substrate having a second diameter larger than the first diameter, a diameter of the second groove being larger than a diameter of the first groove;
      a first chucking region group having a plurality of chucking regions in a region surrounded by the first groove; and
      a second chucking region group having a plurality of chucking regions in a region between the first groove and the second groove, and
   wherein the control unit controls the chucking forces of the first groove, the second groove, the plurality of chucking regions of the first chucking region group, and the plurality of chucking regions of the second chucking region group.

2. The apparatus according to claim 1, wherein the plurality of chucking regions of the first chucking region group has at least four chucking regions.

3. The apparatus according to claim 1, wherein:
   the first substrate has a shape enclosed with an arc having a central angle of not less than 180 degree, and a line connecting two ends of the arc, and
   the first chucking region has a shape matching the shape of the first substrate.

4. The apparatus according to claim 1, wherein:
   the second substrate has a shape enclosed with an arc having a central angle of not less than 180 degree, and a line connecting two ends of the arc, and
   the second chucking region has a shape matching the shape of the second substrate.

5. The apparatus according to claim 1, wherein the first diameter is φ300 mm, and the second diameter is φ450 mm.

6. The apparatus according to claim 1, wherein the chucking force is generated by a negative pressure between the chucking region and the substrate.

7. The apparatus according to claim 1, wherein:
   the plurality of chucking regions form spaces defined by partitions, and
   the chucking force is obtained by a negative pressure generator configured to set the space at a negative pressure.

8. The apparatus according to claim 7, wherein the substrate holder includes a plurality of posts that come in contact with the substrate, in at least one of the plurality of chucking regions.

9. The apparatus according to claim 1, wherein the first chucking region and the second chucking region are concentrically arranged.

10. The apparatus according to claim 1, wherein the control unit controls a chucking region as a chucking force control target among the plurality of chucking regions, in accordance with a position on the substrate where the pattern of the mold is to be formed on the imprint material by bringing the pattern of the mold into contact with the imprint material on the substrate.

11. A method of manufacturing an article, the method comprising steps of:
   forming a pattern on an imprint material on a substrate using an imprint apparatus having a mold with the pattern; and
   processing the substrate on which the pattern is formed in the preceding step,
   wherein the imprint apparatus includes:
      a substrate holder including a plurality of chucking regions for chucking the substrate; and
      a control unit configured to control chucking forces of the plurality of chucking regions,
      wherein the plurality of chucking regions include:
         a first chucking region having a first groove having a ring shape for chucking a periphery of a first substrate having a first diameter;
         a second chucking region having a second groove having a ring shape for chucking a periphery of a second substrate having a second diameter larger than the first diameter, a diameter of the second groove being larger than a diameter of the first groove;
         a first chucking region group having a plurality of chucking regions in a region surrounded by the first groove; and
         a second chucking region group having a plurality of chucking regions in a region between the first groove and the second groove, and
      wherein the control unit controls the chucking forces of the first groove, the second groove, the plurality of chucking regions of the chucking region group, and the plurality of chucking regions of the second chucking region group.

* * * * *